United States Patent
Tsubuku

(10) Patent No.: US 11,901,465 B2
(45) Date of Patent: Feb. 13, 2024

(54) OPTICAL SENSOR

(71) Applicant: Japan Display Inc., Tokyo (JP)

(72) Inventor: Masashi Tsubuku, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/841,731

(22) Filed: Jun. 16, 2022

(65) Prior Publication Data

US 2022/0310855 A1 Sep. 29, 2022

Related U.S. Application Data

(63) Continuation of application No. PCT/JP2020/040289, filed on Oct. 27, 2020.

(30) Foreign Application Priority Data

Dec. 20, 2019 (JP) ................................. 2019-230550

(51) Int. Cl.
 *H01L 31/0216* (2014.01)
 *H01L 31/0224* (2006.01)

(52) U.S. Cl.
 CPC ................. *H01L 31/02164* (2013.01); *H01L 31/022408* (2013.01); *H01L 31/022483* (2013.01)

(58) Field of Classification Search
 CPC ....... H01L 31/02164; H01L 31/022408; H01L 31/022483; H01L 31/1136; H01L 31/02005; H01L 21/8234; H01L 27/088; H01L 27/146; H01L 29/66477; H01L 29/786; H04N 25/70
 See application file for complete search history.

(56) References Cited

U.S. PATENT DOCUMENTS

| 2005/0176194 A1* | 8/2005 | Sasaki ................. H01L 27/1251 257/E27.111 |
| 2011/0080390 A1* | 4/2011 | Katoh ..................... G06F 3/042 345/207 |
| 2012/0013595 A1* | 1/2012 | Murai ................... G06F 3/0412 345/87 |
| 2013/0092927 A1 | 4/2013 | Murai et al. |

(Continued)

FOREIGN PATENT DOCUMENTS

JP 2003-110197 A 4/2003

OTHER PUBLICATIONS

International Search Report dated Dec. 22, 2020 in PCT/JP2020/040289 filed on Oct. 27, 2020, 2 pages.

(Continued)

*Primary Examiner* — Sitaramarao S Yechuri
(74) *Attorney, Agent, or Firm* — Maier & Maier, PLLC

(57) ABSTRACT

The optical sensor includes a substrate, a first transistor for functioning as a light-receiving element and a second transistor for writing/reading in a pixel region provided on the substrate. The first transistor is formed by a transistor using polycrystalline silicon, the second transistor is formed by a transistor using an oxide semiconductor. A light-shielding layer is provided on the back side of the oxide semiconductor of the second transistor. Thus, it is possible to irradiate light to the optical sensor for a long time, and in addition to increasing the amount of light received by the first transistor, it is possible to suppress variations in the characteristics of the second transistor.

9 Claims, 12 Drawing Sheets

(56) References Cited

U.S. PATENT DOCUMENTS

2017/0084636 A1\* 3/2017 Lin .................... H01L 27/1288
2018/0039882 A1   2/2018 Ikeda et al.
2018/0175077 A1\* 6/2018 Koo .................... H10K 59/126
2021/0012082 A1   1/2021 Uchida et al.
2021/0159254 A1\* 5/2021 Qu ..................... H01L 27/1225

OTHER PUBLICATIONS

Office Action dated Mar. 28, 2023, in corresponding Japanese Application No. 2019230550, 10 pages.

\* cited by examiner

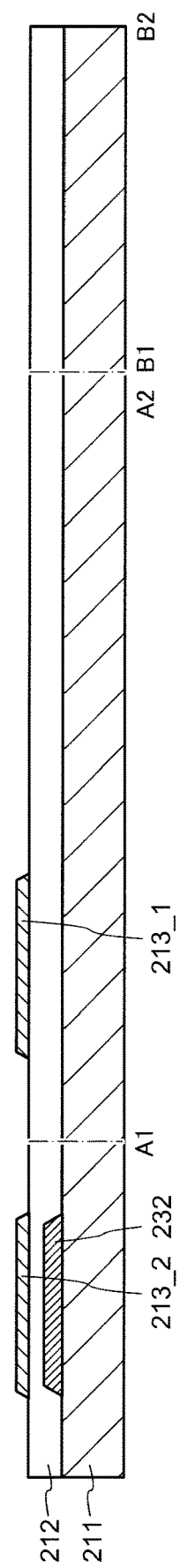

OPTICAL SENSOR

CROSS-REFERENCE TO RELATED APPLICATIONS

This application is a Continuation of International Patent Application No. PCT/JP2020/040289, filed on Oct. 27, 2020, which claims the benefit of priority to Japanese Patent Application No. 2019-230550, filed on Dec. 20, 2019, the entire contents of which are incorporated herein by reference.

FIELD

One embodiment of the present invention relates to an optical sensor comprising low temperature polycrystalline silicon and an oxide semiconductor.

BACKGROUND

A number of types of optical sensor have become mainstream such as a type using amorphous silicon in which a large area is possible or a type using single-crystal silicon in which high definition is possible. In contrast, a type of optical sensor including low-temperature polycrystalline silicon capable of both a large-area and high-definition is expected.

However, the variation in characteristics in low-temperature polycrystalline silicon compared to single-crystal silicon is large, and the noise at the time of amplifying a signal due to a photo-electric current detected by a photodiode becomes large which causes problems to occur. To solve this problem, it is necessary to increase the photo-electric current of the photodiode. For example, achieving a thick film of low-temperature polycrystalline silicon is conceivable. However, in low-temperature polycrystalline silicon, it is difficult to form a thick and uniform p-i-n laminate structure in the thickness direction compared with amorphous silicon.

An optical sensor disclosed in Patent Literature 1 (Japanese patent publication No. 5174988), which uses amorphous silicon or microcrystalline silicon as alight receiving element, uses an oxide semiconductor for the peripheral circuit and the pixel transistor.

SUMMARY

An optical sensor according to an embodiment of the present invention includes a substrate, and a first transistor, a second transistor, and a first light-shielding layer in a pixel area on the substrate, the first transistor including, a first polycrystalline silicon layer provided on the substrate, a first insulating film provided on the first polycrystalline silicon layer, a first gate electrode having a region overlapping the first polycrystalline silicon layer provided on the first insulating film, a second insulating film and a third insulating film provided on the first gate electrode, and a first source electrode and a drain electrode electrically connected to the first polycrystalline silicon layer through openings provided in the second insulating film and the third insulating film, the second transistor including, an oxide semiconductor layer provided on the second insulating film, the third insulating film provided on the oxide semiconductor layer, a second gate electrode provided on the third insulating film, a fourth insulating film provided on the second gate electrode, and a second source electrode and a second drain electrode electrically connected to the oxide semiconductor layer through openings provided in the fourth insulating film, wherein the first light-shielding layer is provided between the first insulating film and the second insulating film and has a region overlapping the oxide semiconductor layer.

BRIEF DESCRIPTION OF DRAWINGS

FIG. 8A is a cross-sectional view illustrating a manufacturing method of an optical sensor according to an embodiment of the present invention.

DESCRIPTION OF EMBODIMENTS

Figure 1:
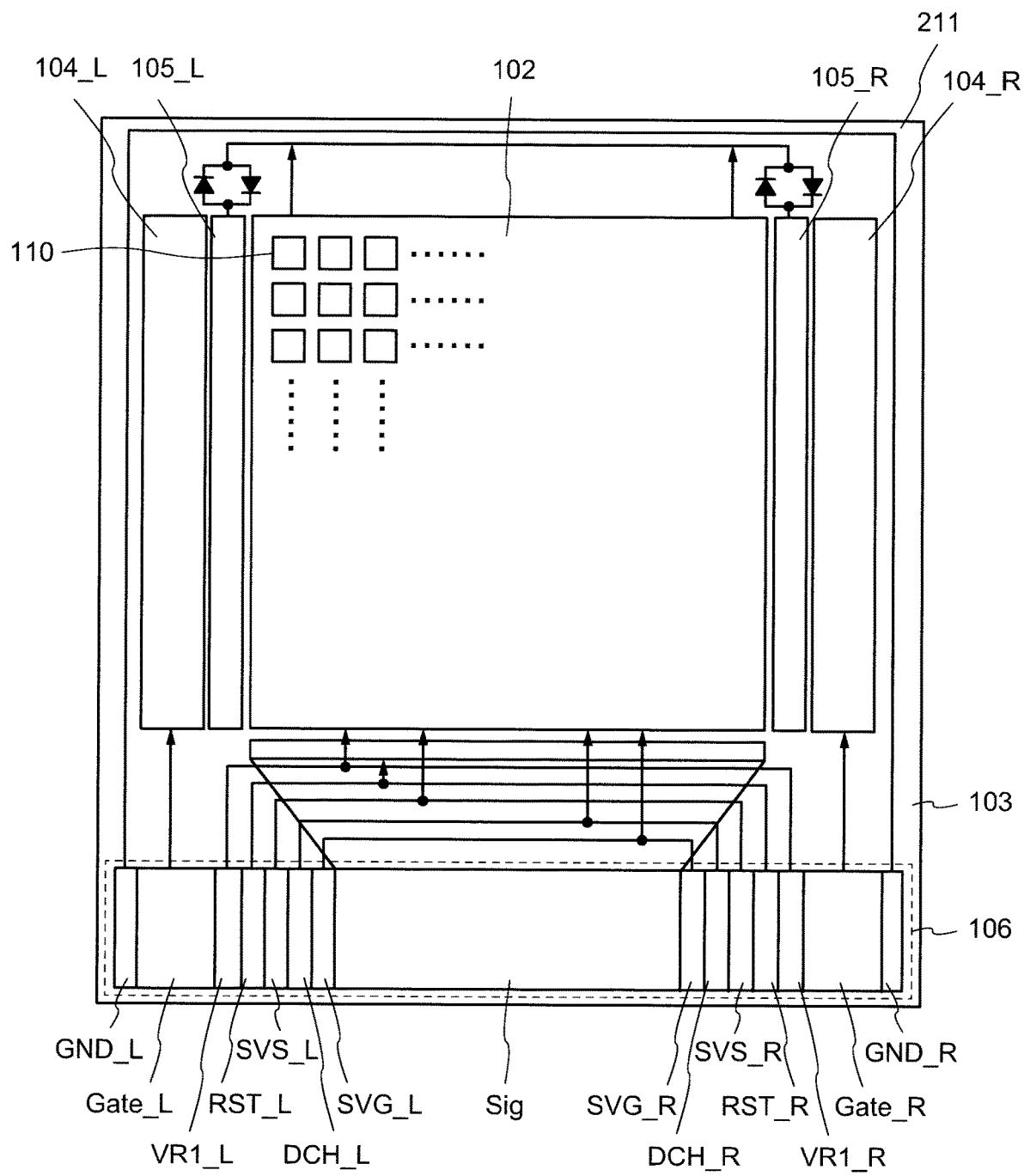
FIG. 1 is a layout diagram of an optical sensor according to an embodiment of the present invention.

The optical sensor disclosed in Patent Literature 1 is assumed to be incorporated in a liquid crystal display. Therefore, its ability as an optical sensor has not sufficiently considered, and it is insufficient in terms of performance. In particular, although the photo-electric current of the amorphous silicon can be sufficiently obtained, it becomes nMOS circuit having a low driving capability since the peripheral circuit is formed of an oxide semiconductor. Therefore, there is a problem whereby the optical sensor cannot be provided with high functionality.

In order to deal with the problems described above, the optical sensor according to one embodiment of the present invention disclosed below is provided with a large area and a high definition.

Embodiments of the present invention will be described below with reference to the drawings and the like. However, the present invention can be implemented in many different modes, and should not be construed as being limited to the description of the following embodiments. In addition, although the drawings may schematically represent the width, thickness, shape, and the like of each portion as compared with actual embodiments for the sake of clarity of description, the drawings are merely an example and do not limit the interpretation of the present invention. In this specification and each drawing, the same reference numerals are assigned to the same elements as those described previously with reference to the preceding drawings, and a detailed description thereof may be omitted as appropriate.

First Embodiment

In the present embodiment, an optical sensor 100 according to an embodiment of the present invention will be described with reference to FIG. 1 to FIG. 10.

FIG. 1 is a layout diagram of the optical sensor 100 according to an embodiment of the present invention. In a sensor region 102 of a substrate 211, a plurality of sensor pixels 110 are arranged in an array. Further, a peripheral region 103 is provided so as to surround the sensor region 102. Driver circuits 104_R, 104_L, protective circuits 105_R, 105_L, a terminal region 106, and the like are provided in the peripheral region 103.

The driver circuits 104_R, 104_L are arranged on the right and left sides of the sensor region 102. The protective circuit 105_R is provided between the sensor region 102 and the driver circuit 104_R. The protective circuit 105_L is provided between the sensor region 102 and the driver circuit 104_L.

The terminal region 106 is a plurality of terminals for inputting a signal to the sensor region 102. Various signals are input to each of the terminals GND_L, Gate_L, VR1_L, RST_L, SVS_L, DCH_L, SVG_L, Sig, GND_R, Gate_R, VR1_R, RST_R, SVS_R, DCH_R, and SVG_R. The signal input from the terminal Gate_L is input to the driver circuit 104_L and input to the sensor region 102 via the protective circuit 105_L. In addition, signals input from the terminals VR1_L, RST_L, SVS_L, DCH_L, SVG_L, and Sig are also input to the sensor region 102. In addition, signals input from the terminals VR1_R, RST_R, SVS_R, DCH_R, and SVG_R are also input to the sensor region 102. Various signals input to the terminal region 106 will be described in detail with reference to the pixel circuit shown in FIG. 2 and the timing chart shown in FIG. 3.

Pixel Circuit

Figure 2:
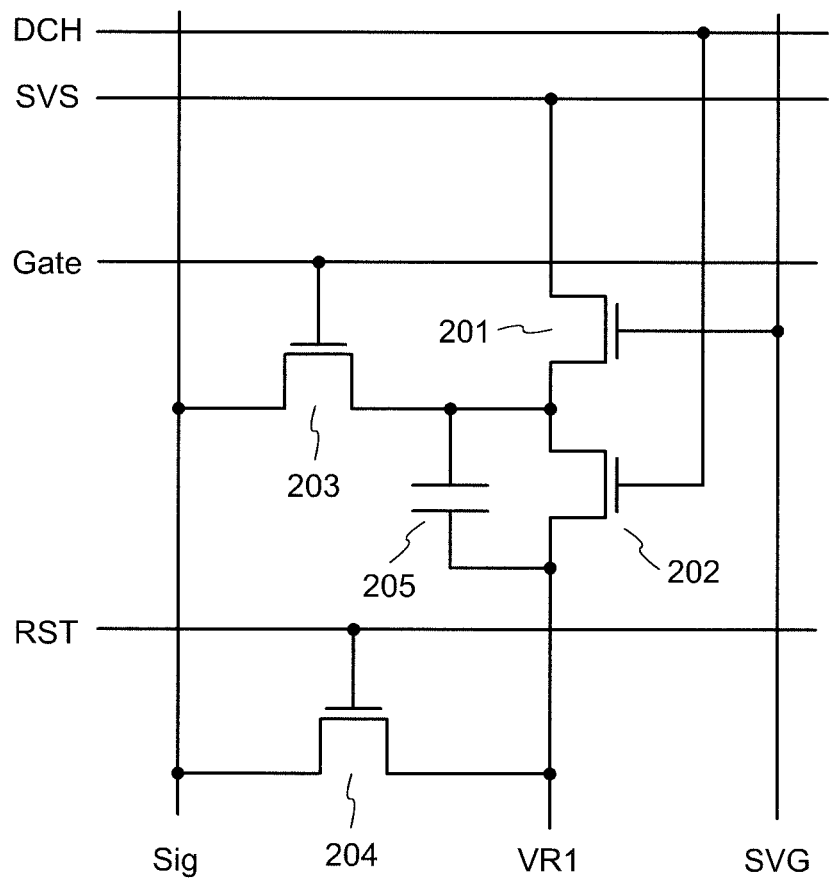
FIG. 2 is a circuit diagram of a sensor pixel according to an embodiment of the present invention.

FIG. 2 is the pixel circuit each having a plurality of sensor pixels 110 arranged in the sensor region 102. Each of the plurality of sensor pixels 110 has at least transistors 201 to 204 and a capacitive element 205. In the sensor pixel 110 shown in FIG. 2, Gate, SVS, DCH, RST, Sig, VR1, and SVG respectively correspond to wirings which are input with the signals input to the terminal region 106 shown in FIG. 1.

The transistor 201 functions as a light-receiving element. The transistor 201 is formed using polycrystalline silicon. A gate of the transistor 201 is electrically connected to the first wiring SVG, one of a source or drain is electrically connected to one of the source and or drain of the transistor 202, one of the source or the drain of the transistor 203, and one of the electrodes of the capacitive element 205, and the other of the source or the drain is electrically connected to the second wiring SVS.

The transistors 202, 203 are transistors for performing writing/reading of the photo-electric current detected by the transistor 201. The transistors 202, 203 are formed using an oxide semiconductor. A gate of transistor 203 is electrically connected to the third wiring Gate, and the other of the source or the drain is electrically connected to the fourth wiring Sig. A gate of the transistor 202 is electrically connected to the fifth wiring DCH, the other of the source or the drain is electrically connected to the other of the electrodes of the capacitive element, one of the source or the drain of the transistor 204, and the sixth wiring VR1.

The transistor 204 is a reset transistor. The transistor 204 is formed using an oxide semiconductor. A gate of the transistor 204 is electrically connected to the seventh wiring RST, and the other of the source or the drain is electrically connected to the fourth wiring Sig.

It is difficult to form a p-i-n layer for forming a photodiode with thick films when the photodiode and the transistor are formed in the same layer using low-temperature polycrystalline silicon. Therefore, photodiodes require a structure that allows a current to flow in the planar direction. In this case, even if the size of the low-temperature polycrystalline silicon is set to W/L=3 mm/3 μm in which a current flows easily in the planer direction, it is only possible to obtain a photo-electric current of about 1 nA. In addition, the off-current of the transistor using low-temperature polycrystalline silicon flows at about 1 pA to 10 pA, depending on the conditions of the p-i-n layers. Therefore, when trying to manufacture a large-area optical sensor, there is a problem whereby it is difficult to detect the photo-electric current of the selected pixel due to the off-current of the transistor connected in parallel to the same signal line.

Therefore, in the optical sensor 100 according to an embodiment of the present invention, the transistor 201 functioning as a light-receiving element is made of polycrystalline silicon, and the transistors 202 to 204 for writing/reading are made of an oxide semiconductor. Also, the off-current of transistors 202 to 204 using an oxide semiconductor is 1 fA, which can be very small. Therefore, it is possible to suppress the photo-electric current detected by the transistor 201 from leaking through the transistors 202 to 204. Thus, even in the case of a minute photo-electric current which is detected from the transistor using polycrystalline silicon, it is possible to detect the photo-electric current with good sensitivity. Further, since it is possible to reduce the influence of the off-current of the transistor connected in parallel to the same signal line, it is possible to increase the area of the optical sensor. Further, it is possible to irradiate light from the substrate 211 side (the back side of the substrate 211) of the optical sensor 100 for a long time, so that the amount of light received can be increased. Thus, it is possible to suppress variations in the characteristics of the transistor 201 in the plurality of sensor pixels 110. Furthermore, it is possible to increase the amount of light received by exposing the optical sensor 100 to light for an extended period of time, so that the size of the polycrystalline silicon layer can be reduced to, for example, W/L=120/3.5 μm. In addition, the size of an oxide semiconductor layer can be set to, for example, W/L=240/3.5 μm. That is, since it is possible to reduce the size of each transistor, it is possible to increase the resolution of the optical sensor 100.

Timing Chart of the Pixel Circuit

Figure 3:
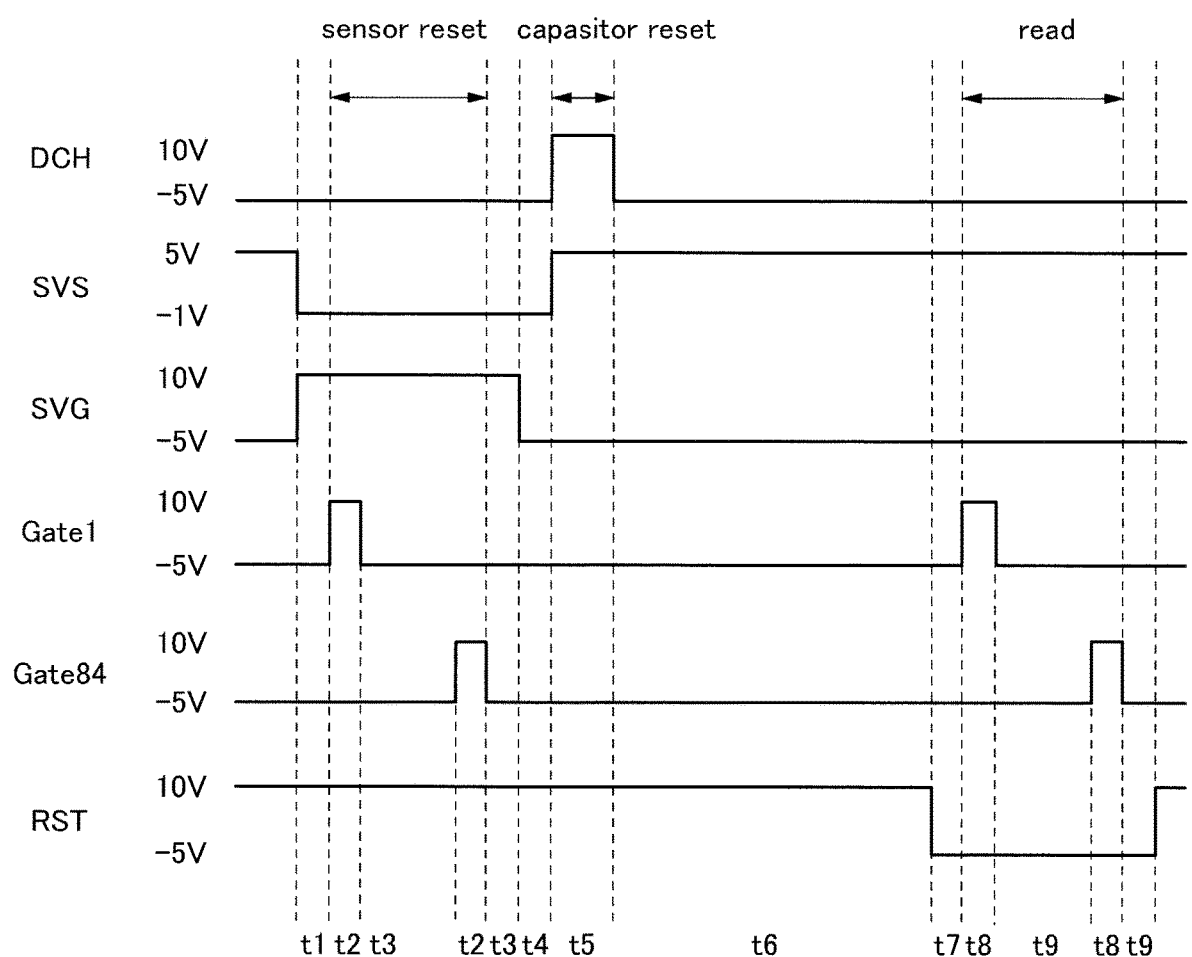
FIG. 3 is a timing chart of the sensor pixel according to an embodiment of the present invention.

FIG. 3 is a timing chart of the sensor pixel 110. The signals Gate, SVS, DCH, RST, Sig, VR1 and SVG in the timing chart shown in FIG. 3 respectively correspond to a signal input to the terminal region 106 shown in FIG. 1 and a signal input to the first wiring to the seventh wiring shown in FIG. 2. Further, a wiring Gate1 corresponds to the third wiring Gate1 of the first row, and a wiring Gate84 corresponds to the third wiring Gate84 of the 84 row.

First, the transistors 201, 204 are in an ON state by supplying high level potentials to the first wiring SVG and the seventh wiring RST before resetting the sensor pixel 110 in a period t1. Further, the transistors 202, 203 are set to the OFF state by supplying a low level potential to the fifth wiring DCH and the third wiring Gate1. Also, the second wiring SVS is supplied with a low-level potential.

Next, the sensor pixel 110 is reset during periods t2 and t3. The transistors 201, 204 are in the ON state and the transistor 203 is in the OFF state in the period t2. The transistor 202 is changed from an OFF state to an ON state by changing the third wiring Gate1 from a low level potential to a high level potential. Thus, it is possible to reset the optical response to the initial state by causing a reset current to flow from the sixth wiring VR1 to the transistor 201 via the transistors 204,202. Thereafter, the transistor 202 is changed from an ON state to an OFF state by changing the third wiring Gate1 from a high level potential to a low level potential in a period t3, thereby completing the reset of the sensor pixel 110.

Next, the transistor 101 is changed from the ON state to the OFF state by changing the first wiring SVG from a high-level potential to a low-level potential in period t4, before resetting the capacitive element 205.

Next, the capacitive element 205 is reset in a period t5. The transistor 203 is changed from an OFF state to an ON state by changing the fifth wiring DCH from a low-level potential to a high-level potential in a period t5. Further, a low-level potential supplied to the second wiring SVS is changed to a high-level potential. Thus, the charge stored in the capacitive element 205 can be changed to a constant potential by the transistor 203. Thereafter, by changing the fifth wiring DCH from a high-level potential to a low-level potential, the reset operation of the capacitive element 205 is complete by switching the transistor 203 from the ON state to the OFF state.

Next, the sensor pixel is irradiated with light in the period t6 (exposure period). The transistor 201 in the OFF state is irradiated with light, so that charges are accumulated in the capacitive element 205 according to the amount of irradiated light. The period t6 is, for example, about 1 second.

Next, the transistor 204 is changed from the ON state to the OFF state by changing the seventh wiring RST from a high-level potential to a low-level potential before the charge stored in the capacitive element 205 is read in the period t7.

Next, the charge stored in the capacitive element 205 is read out in a period t8. The transistor 202 is changed from an OFF state to an ON state by changing the third wiring Gate1 from a low-level potential to a high-level potential in a period t8. Thus, it is possible to read out the charge stored according to the light amount stored in the capacitive element 205 from the fourth wiring Sig through the transistor 204.

Finally, the third wiring Gate1 is changed from a high-level potential to a low-level potential in a period t9, the transistor 202 is changed from an ON state to an OFF state, and the readout of charges is finished. In the above-described driving methods, although the third wiring Gate1 is exemplified, the third wiring Gate84 is also the same.

Planer Layout View of an Optical Sensor

Figure 4:
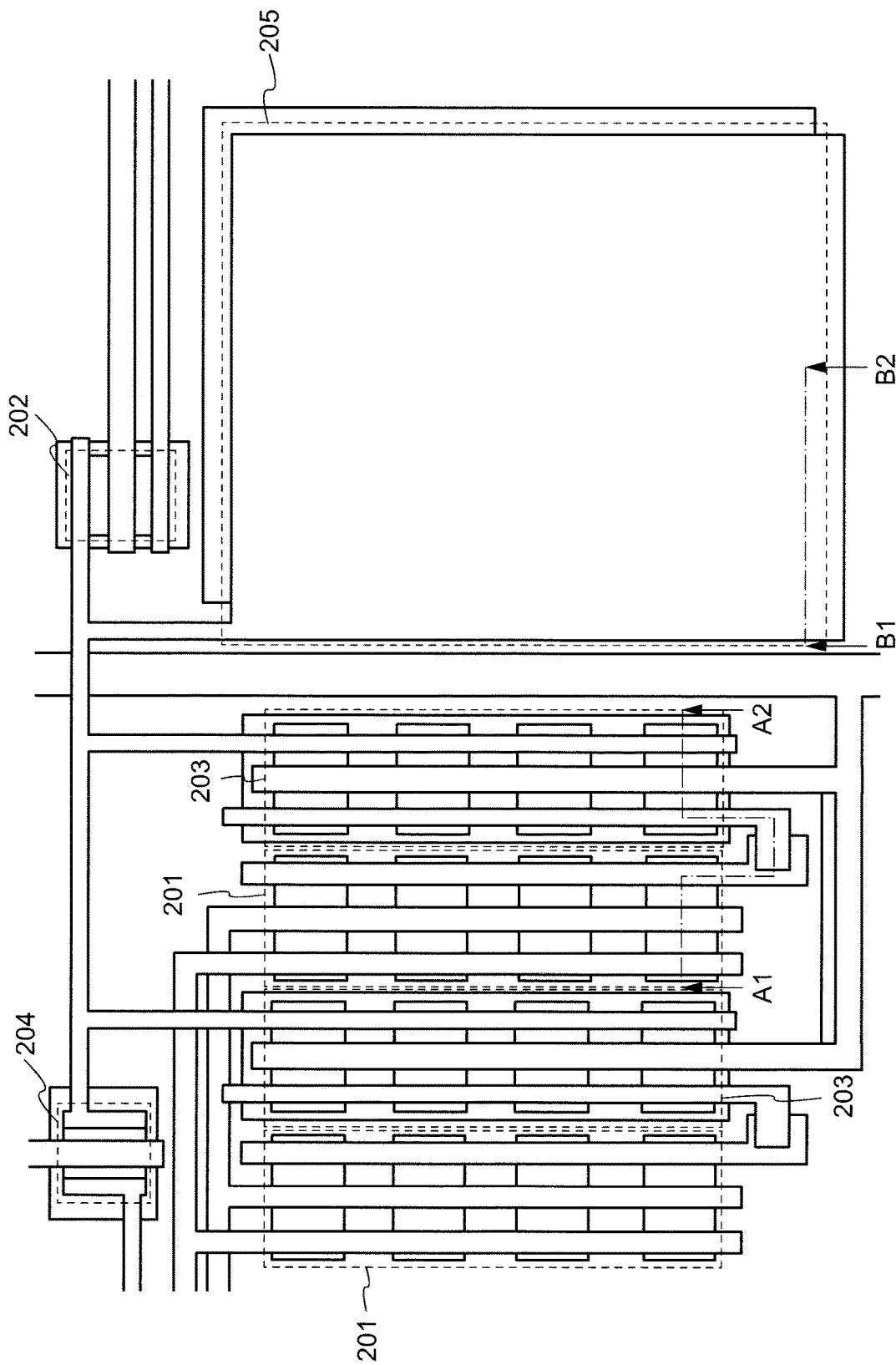
FIG. 4 is a planar layout of the sensor pixel according to an embodiment of the present invention.
Figure 5:
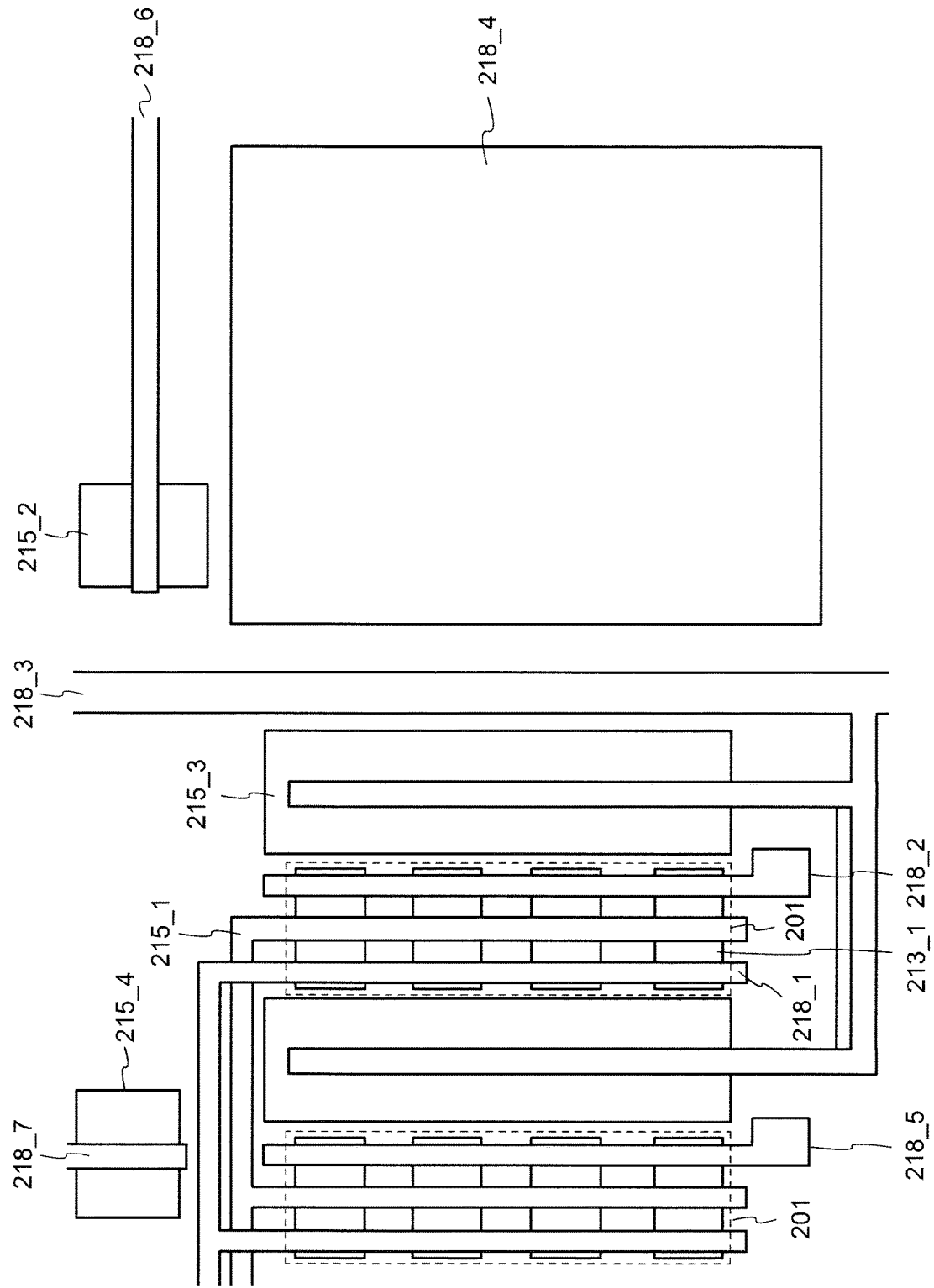
FIG. 5 is a planar layout of the sensor pixel according to an embodiment of the present invention.
Figure 6:
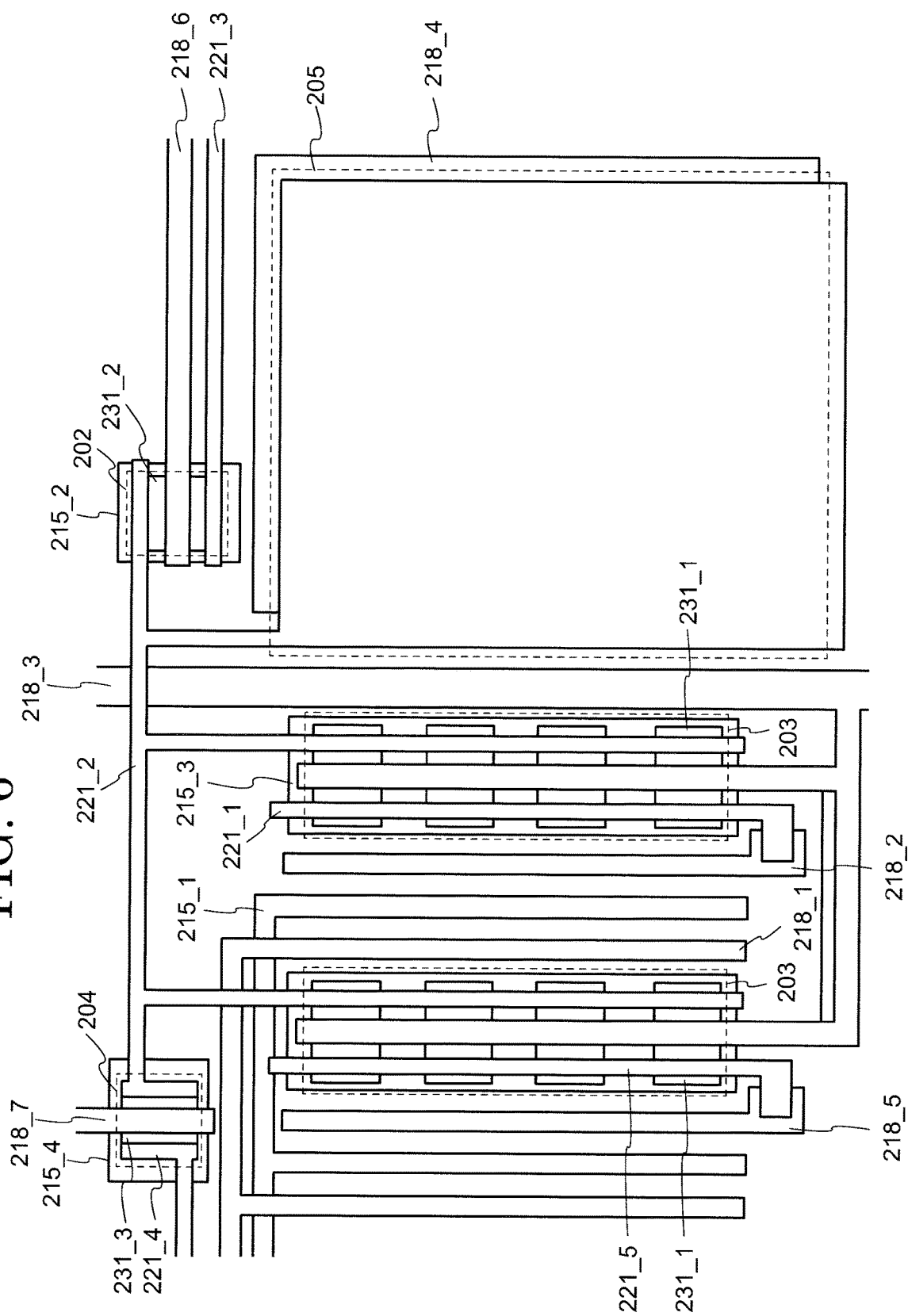
FIG. 6 is a planar layout of the sensor pixel according to an embodiment of the present invention.

Next, the structure of the optical sensor 100 will be described in detail with reference to FIG. 4 to FIG. 7. FIG. 4 is a planar layout view of the optical sensor 100. FIG. 5 is a planar layout of transistors using polycrystalline silicon of the optical sensor 100. FIG. 6 is a planar layout of transistors using an oxide semiconductor of the optical sensor 100. In FIG. 4 to FIG. 6, only the semiconductor layer and the conductive layer are illustrated, and the insulating film is not illustrated.

FIG. 4 shows the transistors 201 to 204 and the capacitive element 205. In FIG. 4, a structure of four transistors connected in series and four transistors connected in series connected in parallel is regarded as one transistor 201. Similarly, a structure of four transistors connected in series and four transistors connected in series connected in parallel is regarded as one transistor 203.

As shown in FIG. 5, the transistor 201 using polycrystalline silicon is arranged. A semiconductor layer 213_1 made of polycrystalline silicon and included in the transistor 201 is arranged. Eight semiconductor layers 213_1 are arranged. Conductive layers 215_1 to 215_4 are arranged on the semiconductor layer 213_1. The conductive layer 215_1 functions as a gate electrode of the transistor 201. The conductive layer 215_2 functions as a light-shielding layer of the transistor 202. The conductive layer 215_3 functions as a light-shielding layer of the transistor 203. The conductive layer 215_4 functions as a light-shielding layer of the transistor 204. Conductive layers 218_1 to 218_7 are arranged on the conductive layers 215_1 to 215_4. The conductive layer 218_1 functions as the other of the source or drain electrode of transistor 201, and the conductive layers 218_2, 218_5 function as one of the source or drain electrodes of transistor 201. The conductive layer 218_3 functions as a gate electrode of the transistor 203. The conductive layer 218_4 functions as one of the electrodes of the capacitive element. The conductive layer 218_6 functions as a gate electrode of the transistor 202, and the conductive layer 218_7 functions as a gate electrode of the transistor 204.

As shown in FIG. 6, the transistors 202 to 204 and the capacitive element 205 using an oxide semiconductor are arranged. The conductive layers 215_2 to 215_4 functioning as the above-described light-shielding layers are arranged under the transistors 202 to 204. Semiconductor layers 231_1 to 231_3 made of an oxide semiconductor included in the transistors 202 to 204 are arranged on the conductive layers 215_2 to 215_4. In addition, eight semiconductor layers 231_1 are arranged. The conductive layers 218_1 to 218_7 are arranged on the semiconductor layers 231_1 to 231_4. The conductive layers 221_1 to 221_5 are arranged on the conductive layers 218_1 to 218_7. The conductive layers 221_1, 221_5 function as one of the source and drain electrodes of the transistor 203. The conductive layer 221_2 functions as the other of the source and drain electrode of the transistor 203, the one of the source and drain electrode of the transistor 202, the one of the source and drain electrode of the transistor 204, and the other of the electrode of the capacitive element 205. The conductive layer 221_3 functions as the other of the source and drain electrode of the transistor 202, and the conductive layer 221_4 functions as the other of the source and drain electrode of the transistor 204.

Cross-Sectional View of the Optical Sensor

Figure 7:
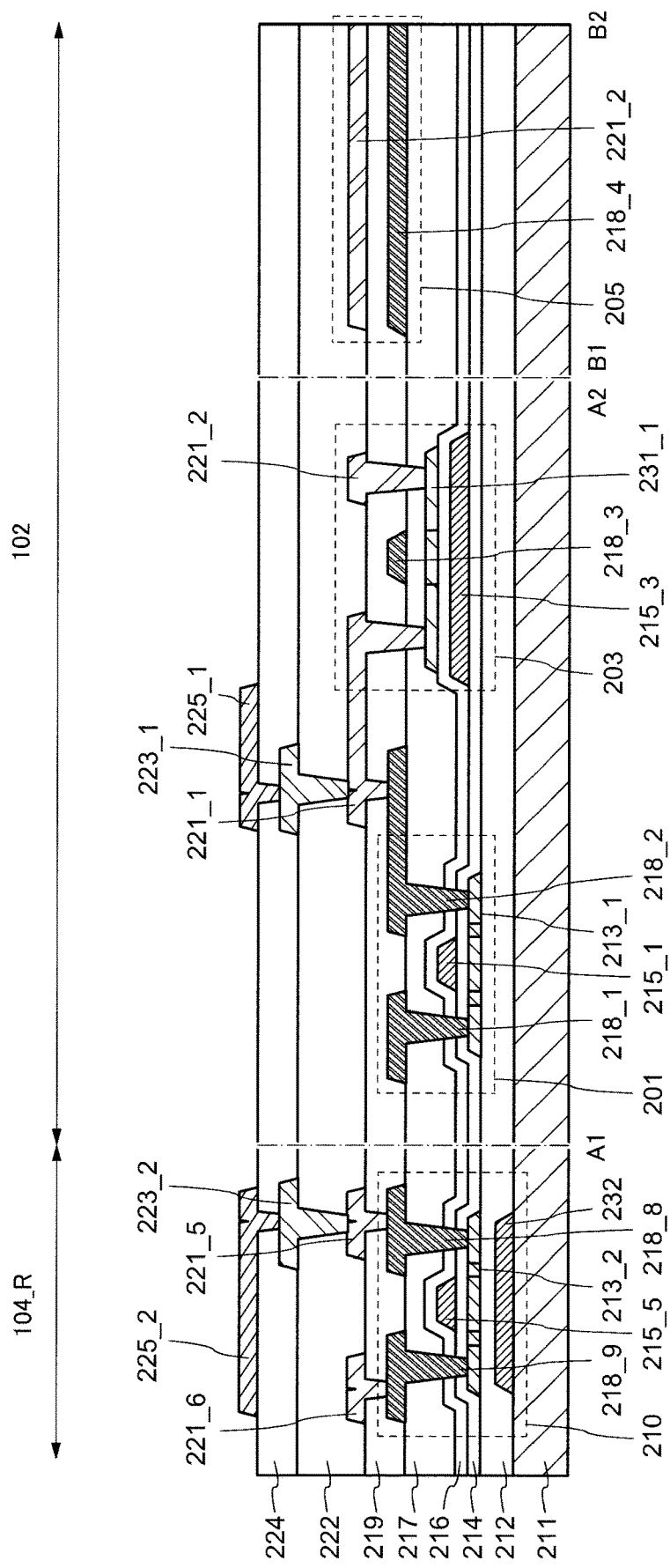
FIG. 7 is a cross-sectional view of transistors constituting an optical pixel and a driver circuit.

FIG. 7 shows a cross-sectional view of the sensor pixel 110 taken along line A1-A2, and a cross-sectional view taken along line B1-B2 shown in FIG. 4 are illustrated together. FIG. 7 also shows a cross-sectional view of the driver circuit 104_R not shown in FIG. 4. FIG. 7 shows a cross-sectional view of the transistor 201 as the sensor pixel 110, the transistor 203 and the capacitive element 205, and a cross-sectional view of the transistor 210 in the driver circuit 104_R as the peripheral region 103. Note that a structure of transistors included in the driver circuit 104_L and the protective circuits 105_R, 105_L is also similar to that of the transistor 210. Light is irradiated from the backside of the substrate 211 to the sensor pixel 110.

The transistor 201, which functions as a light-receiving element is provided on the substrate 211 via the underlying insulating film 212. The transistor 201 includes at least a semiconductor layer 213_1, an insulating film 214, and a conductive layer 215_1. The semiconductor layer 213_1 used for the transistor 201 is made of polycrystalline silicon. Further, adding an impurity imparting n-type to the semiconductor layer 213-1 forms low-concentration impurity regions and high-concentration impurity regions. Here, the insulating film 214 functions as a gate insulating film of the transistor 201. Further, insulating films 216, 217 are provided on the conductive layer 215_1. Conductive layers 218_1, 218_2 are provided on the insulating film 217. The conductive layers 218_1, 218_2 are electrically connected to the semiconductor layer 213_1 through openings provided in the insulating films 216, 217. The insulating films 216, 217 function as interlayer insulating films.

An insulating film 219 is provided on the conductive layers 218_1, 218_2. The conductive layer 221_1 is provided on the insulating film 219. The conductive layer 221_1 is connected to the conductive layer 218_2 through an opening provided in the insulating film 219.

The transistor 203 is provided on the insulating film 214. The transistor 203 is also a top gate type transistor. The conductive layer 215_3 is provided between the insulating film 214 and the insulating film 216. The transistor 203 includes at least the semiconductor layer 231_1, the insulating film 217, and the conductive layer 218_3. The semiconductor layer 231_1 used for the transistor 203 is an oxide semiconductor. Further, the insulating film 217 functions as a gate insulating film of the transistor 203. The insulating film 219 is provided over the conductive layer 218_3. The conductive layers 221_1, 221_2 are provided over the insulating film 219. The conductive layers 221_1, 221_2 are electrically connected to the semiconductor layer 231_1 through openings provided in the insulating films 217, 219. The conductive layer 221_1 is connected to the conductive layer 218_2 provided in the insulating film 217. The insulating film 219 functions as an interlayer insulating film. An insulating film 222 is provided on the conductive layers 221_1, 221_2. An insulating film 224 is provided on the insulating film 222. The transistors 202, 204 are also transistors using an oxide semiconductor as the semiconductor layer and have the same structure as the transistor 203. Further, with respect to the transistors 202, 204, a conductive layer that functions as a light-shielding layer is provided.

The capacitive element 205 includes a conductive layer 218_4, the conductive layer 221_2, and the insulating film 219 provided between the conductive layer 218_4 and the conductive layer 221_2 over the insulating film 217. Further, the capacitive element 205 may further include a conductive layer between the insulating film 214 and the insulating film 216.

The transistor 210 is provided on the substrate 211. The transistor 210 is a top gate type transistor. Further, a conductive layer 232 that functions as a light-shielding layer is provided between the substrate 211 and the underlying insulating film 212. The conductive layer 232 functioning as a light-shielding layer of the transistor 210 is provided in a lower layer than the conductive layer 215_3 functioning as a light-shielding layer of the transistor 203. The semiconductor layer 213_2 used for the transistor 210 is made of polycrystalline silicon. Further, adding an impurity imparting n-type to the semiconductor layer 213_2 forms low-concentration and high-concentration impurity regions. Here, the insulating film 214 functions as a gate insulating film of the transistor 210. Further, the conductive layer 215_5 is provided on the insulating film 214. The conductive layer 215_5 functions as a gate electrode of the transistor 210. The insulating films 214, 216 are provided over the conductive layer 215_5. The conductive layers 218_8, 218_9 are provided over the insulating film 216. The conductive layers 218_8, 218_9 are electrically connected to the semiconductor layer 213_2 through openings provided in the insulating films 214, 216. In other words, the insulating films 214, 216 function as an interlayer insulating film. Furthermore, although an n-channel transistor structure is exemplified as the transistor 210, an embodiment of the present invention is not limited thereto. For example, in the driver circuits 104_R, 104_L, an n-channel transistor and a p-channel transistor can be combined to form CMOS devices. Further, the insulating film 219 is provided on the conductive layers 218_8, 218_9, and an opening is provided in the insulating film 219. The conductive layer 221_5 is connected to the conductive layer 218_8 through the opening, and the conductive layer 221_6 is connected to the conductive layer 218_9 through the opening.

The insulating film 222 is provided over the conductive layers 221_1 to 221_6. Conductive layers 223_1, 223_2 are provided over the insulating film 222. The conductive layer 223_1 is connected to the conductive layer 221_1 through an opening provided in the insulating film 222. The conductive layer 223_2 is connected to the conductive layer 221_5 through an opening provided in the insulating film 222. An insulating film 224 is provided over the conductive layers 223_1, 223_2. Conductive layers 225_1, 225_2 are provided over the insulating film 224. The conductive layer 225_1 is connected to the conductive layer 223_1 through an opening provided in the insulating film 224. The conductive layer 225_2 is connected to the conductive layer 221_5 through an opening provided in the insulating film 224. The conductive layers 223_1, 223_2, 225_1, 225_2 function as lead wirings.

An oxide semiconductor used for the semiconductor layers 231_1 to 231_4 includes a Group 13 element such as indium or gallium. It may contain a plurality of different Group 13 elements and may be a compound of indium and gallium (IGO). The semiconductor layers 231_1 to 231_4 may further include a Group 12 element. The semiconductor layer 231 may include other elements, and may include tin as a Group 14 element, and titanium, zirconium, and the like as a Group 4 element. Examples of oxide semiconductors include indium gallium zinc oxide (IGZO), indium gallium oxide (IGO), indium zinc oxide (IZO), zinc tin oxide (ZnSnO), zinc oxide (ZnO) and transparent amorphous oxide semiconductor (TAOS).

The conductive layers 215_1 to 215_5, the conductive layers 218_1 to 218_9, the conductive layers 221_1 to 221_6, the conductive layers 223_1, 223_2, and the conductive layers 225_1, 225_2 are formed of, for example, molybdenum, chromium, tungsten, aluminum, copper, titanium, nickel, tantalum, silver, or an alloy thereof. The above-mentioned conductive layer is not limited to the above-mentioned metals, and other metals or alloys may be used. The conductive layer is formed by a single layer or a stack of the conductive materials listed above.

The underlying insulating film 212 and the insulating films 214, 216, 217, 219, 222, 224 are formed of a silicon oxide film or an inorganic insulating film such as a silicon nitride film. Further, the present invention is not limited to an inorganic insulating film, and an organic insulating film using an organic resin may be used.

In one embodiment of the present invention, polycrystalline silicon is used for the semiconductor layer 213_1 of the transistor 201 functioning as a light-receiving element in the sensor pixel 110. An oxide semiconductor is used for the semiconductor layers 231_1 to 231_3 of the transistors 202 to 204. The transistor 202 using an oxide semiconductor can make the off-current very small compared to the transistor 201 using polycrystalline silicon. Therefore, even if the photocurrent detected in the transistor is small and there are variations in its characteristics, since the sensing time can be extended and the read charge can be stored, it is possible to reduce the influence of variations in the characteristics of the transistor.

Further, transistors other than the transistor 201 which functions as a light-receiving element include a conductive layer which functions as a light-shielding layer between the substrate 211 and the semiconductor layer, in the optical sensor 100 according to an embodiment of the present invention. Therefore, even if the light from the backside of the substrate 211 is irradiated for a long time, it is possible to suppress the light irradiated to the semiconductor layer of the transistor other than the light-receiving element. Thus, when light is irradiated to the semiconductor layer of the transistors 202 to 204, 210, it is possible to suppress the characteristics of the transistor from fluctuating.

In addition, by configuring the driver circuits 104_R, 104_L with CMOS devices, the current can be easily controlled and the through current can be reduced. Thus, compared with the optical sensor using amorphous silicon, it is possible to perform a drive operation with the reduced noise.

Manufacturing Method of the Optical Sensor

A manufacturing method of the optical sensor 100 according to an embodiment of the present invention will be described with reference to FIG. 8 to FIG. 10. A cross-sectional view shown in FIG. 8 to FIG. 10 corresponds to the cross-sectional view shown in FIG. 7.

FIG. 8A is a diagram illustrating a process of forming the conductive layer 232, the underlying insulating film 212, and the semiconductor layers 213_1, 213_2 over the substrate 211. As the substrate 211, for example, a glass substrate, a flexible substrate such as polyimide, or the like is used. First, a conductive film is formed on the substrate 211 by a sputtering method, and the conductive film is processed by a photolithography step, whereby a conductive layer 232 is formed. The conductive layer 232 is formed of a light-shielding metal material. The conductive layer 232 is provided in a region where the transistor 210 configuring the driver circuits 104_R, 104_L and the protective circuits 105_R, 105_L is provided. The conductive layer 232 is provided for each of the transistors configuring the driver circuits 104_R, 104_L and the protective circuits 105_R, 105_L, and is preferably provided immediately below the semiconductor layer included in the transistor.

Next, an underlying insulating film 212 is formed on the substrate 211 and the conductive layer 232. The underlying insulating film 212 is formed by a CVD method or a sputtering method, for example, using silicon oxide or silicon nitride. The underlying insulating film 212 may be formed by using silicon oxide and silicon nitride as single layers or stacked layers, respectively. Next, a semiconductor film formed of polycrystalline silicon is formed over the underlying insulating film 212, and the semiconductor film is processed by a photolithography process to form semiconductor layers 213_1, 213_2. Here, the semiconductor layer 213_1 is provided in a region which does not overlap the conductive layer 232, and the semiconductor layer 213_2 is provided in a region which overlaps the conductive layer 232.

Figure 8B:
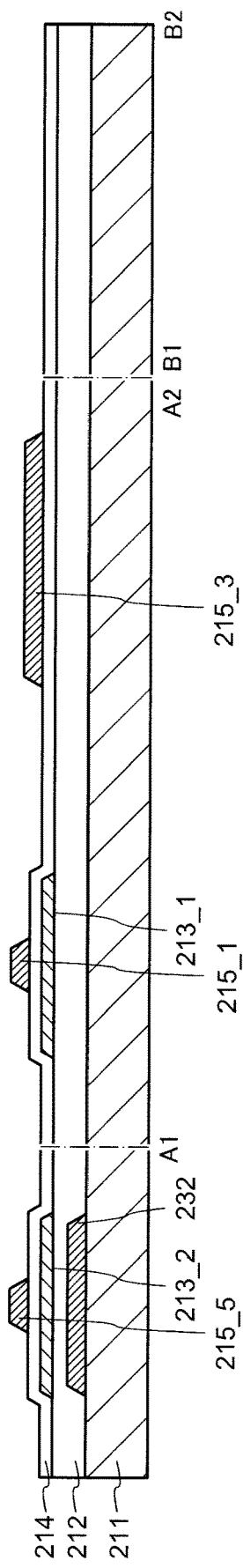
FIG. 8B is a cross-sectional view illustrating a manufacturing method of an optical sensor according to an embodiment of the present invention.

FIG. 8B is a diagram illustrating a process of forming the insulating film 214 and the conductive layers 215_1 to 215_5. First, the insulating film 214 is formed over the semiconductor layers 213_1, 213_2. The insulating film 214 is formed by a CVD method or a sputtering method, for example, using silicon oxide or silicon nitride. As the insulating film 214, for example, a silicon nitride film is formed in contact with the semiconductor layers 213_1, 213_2. A silicon nitride film is a film containing a relatively high-concentration of hydrogen and easily releases hydrogen. By performing a heat treatment in a state where the semiconductor layers 213_1, 213_2 are in contact with the insulating film 214, dangling bonds included in the semiconductor layers 213_1, 213_2 made of polycrystalline silicon can be terminated with hydrogen and rendered inactive. Next, a conductive film is formed over the insulating film 214 by a sputtering method, and the conductive film is processed by a photolithography step, whereby conductive layers 215_1 to 215_5 are formed. Although the conductive layers 215_2, 215_4 are not illustrated in FIG. 8B, the conductive layers 215_2, 215_4 are arranged at positions shown in FIG. 5. The conductive layer 215_1 is formed in a region overlapping the semiconductor layer 213_1, the conductive layers 215_2 to 215_4 are formed in a region overlapping a semiconductor layer formed of an oxide semiconductor layer, and the conductive layer 215_5 is formed in a region overlapping the semiconductor layer 213_3.

Although not illustrated, a doping treatment is performed on the semiconductor layers 213_1, 213_2 using the conductive layers 215_1, 215_5 as masks. Thus, impurity regions are formed in the semiconductor layers 213_1, 213_2. In the case of forming an n-channel transistor, a low-concentration impurity region and a high-concentration impurity region are formed in a semiconductor layer by adding an impurity imparting n-type conductivity. In the case of forming a p-channel transistor, an impurity region is formed by adding an impurity imparting p-type conductivity. In this embodiment, although an n-channel transistor is illustrated in the driver circuits 104_R, 104_L and the sensor pixel 110, the present invention is not limited thereto. As the transistors included in the driver circuits 104_R, 104_L, both an n-channel transistor and a p-channel transistor may be formed.

Figure 9A:
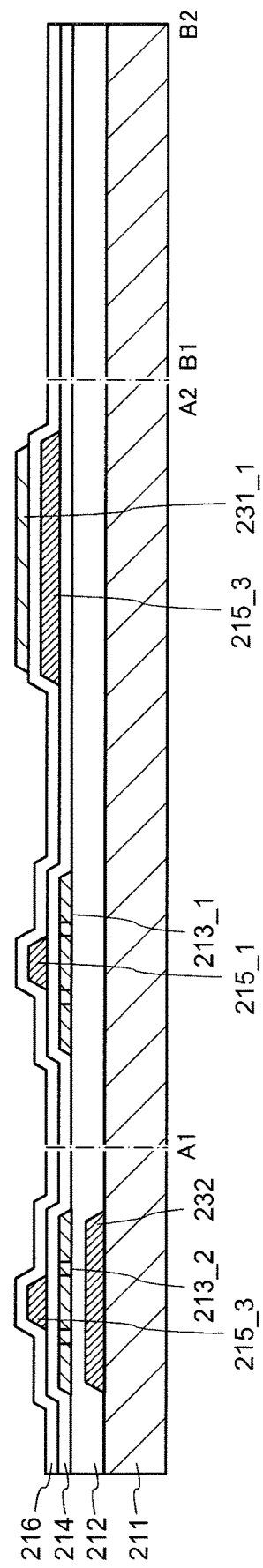
FIG. 9A is a cross-sectional view illustrating a manufacturing method of an optical sensor according to an embodiment of the present invention.

FIG. 9A is a diagram illustrating a process of forming the insulating film 216 and the semiconductor layers 231_1 to 231_4. First, the insulating film 216 is formed over the insulating film 214 and the conductive layers 215_1 to 215_5. The insulating film 216 is formed by a CVD method or a sputtering method, for example, using silicon oxide or silicon nitride.

In the case where an oxide semiconductor is used as a semiconductor layer of a transistor, when hydrogen or moisture enters an oxide semiconductor from an adjacent film, the characteristics of the transistor may be deteriorated. Specifically, a decrease in transistor mobility and variations in threshold values occur. Therefore, as the insulating film in contact with the semiconductor layers 231_1 to 231_2, a film in which the concentration of hydrogen is reduced is preferably used. Therefore, as the insulating film 216, for example, a silicon oxide film is formed by a CVD method. The insulating film 216 may have a stacked-layer structure of a silicon nitride film and a silicon oxide film from the conductive layers 215_1 to 215_3 side.

Next, a semiconductor film using an oxide semiconductor is formed over the insulating film 216 by a sputtering method, and the semiconductor film is processed by a photolithography step, whereby semiconductor layers 231_1 to 231_4 are formed. The semiconductor layer 231_1 is formed over the conductive layer 215_3 functioning as a light-shielding layer. Although the semiconductor layers 231_2 to 231_4 are not shown in the FIG. 9A, the semiconductor layers 231_2 to 231_4 are arranged at the positions shown in FIG. 6.

When a semiconductor film using an oxide semiconductor is processed into the semiconductor layers 231_1 to 231_4, the surfaces of the semiconductor layers 231_1 to 231_4 may be damaged. The damaged regions of the semiconductor layers 231_1 to 231_4 contain many oxygen vacancies. Oxygen vacancies cause a problem whereby the off-leakage current of the transistor increases. In order to reduce the off-leakage current, oxygen needs to be sufficiently introduced into an oxide semiconductor by a heat treatment. Therefore, the heat treatment is preferably performed in a state where a silicon oxide film is in contact with the semiconductor layers 231_1 to 231_4. The heat treatment is preferably performed under, for example, nitrogen, dry air, or an atmospheric atmosphere. As a result, oxygen can be supplied from silicon oxide to the damaged regions of the semiconductor layers 231_1 to 231_4. Therefore, oxygen vacancies contained in the semiconductor layer 231 can be reduced.

Figure 9B:
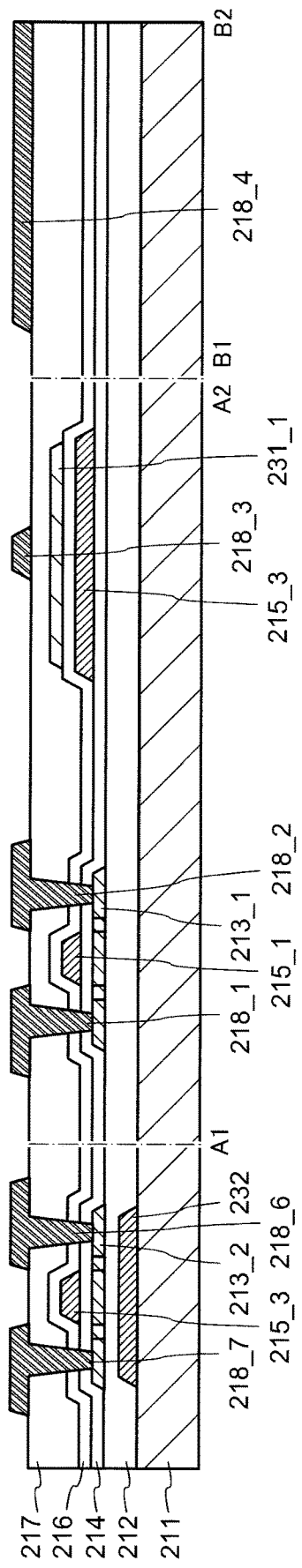
FIG. 9B is a cross-sectional view illustrating a manufacturing method of an optical sensor according to an embodiment of the present invention.

FIG. 9B is a diagram illustrating a process of forming the insulating film 217 and the conductive layers 218_1 to 218_9. First, for example, an insulating film 217 using silicon oxide or silicon nitride is formed on the insulating film 216 and the semiconductor layer 231 by a CVD method or a sputtering method. For the insulating film 217, for example, it is preferred that a silicon oxide film is formed by a CVD method and a silicon nitride film is formed by a sputtering method from the semiconductor layer 231_1 to 231_4 side. After this, a heat treatment may be performed again. The conditions of the heat treatment are the same as those of the heat treatment performed after the formation of the semiconductor layers 231_1 to 231_4. By this heat treatment, oxygen is released from the silicon oxide film in contact with the semiconductor layers 231_1 to 231_4, and oxygen can be supplied to the damaged regions of the semiconductor layers 231_1 to 231_4. Therefore, oxygen vacancies contained in the semiconductor layers 231_1 to 231_4 can be reduced. Note that the heat treatment may be performed at any stage after the formation of the semiconductor layers 231_1 to 231_4 or after the formation of the insulating film 217.

Next, contact holes reaching the semiconductor layers 213_1, 213_2 are formed in the insulating films 216, 217. Next, a conductive film is formed over the insulating film 217 by a sputtering method, and the conductive film is processed by a photolithography process to form conductive layers 218_1 to 218_9. Although the conductive layers 218_5 to 218_7 are not shown in the FIG. 9B, the conductive layers 218_5 to 218_7 are arranged at the positions shown in FIG. 5 and FIG. 6. The conductive layers 218_1, 218_2 are connected to the semiconductor layer 213_1, and the conductive layer 218_3 is provided in a region overlapping the semiconductor layer 231. The conductive layers 218_5, 218_6 are connected to the semiconductor layer 213_2.

Although not illustrated, hydrogen or argon is added to the semiconductor layer 231 by ion implantation with the conductive layer 218_3 used as a mask. Thus, in the semiconductor layer 121, it is possible to form a channel and a low resistance region so as to sandwich the channel in the region overlapping the gate electrode 123.

Figure 10:
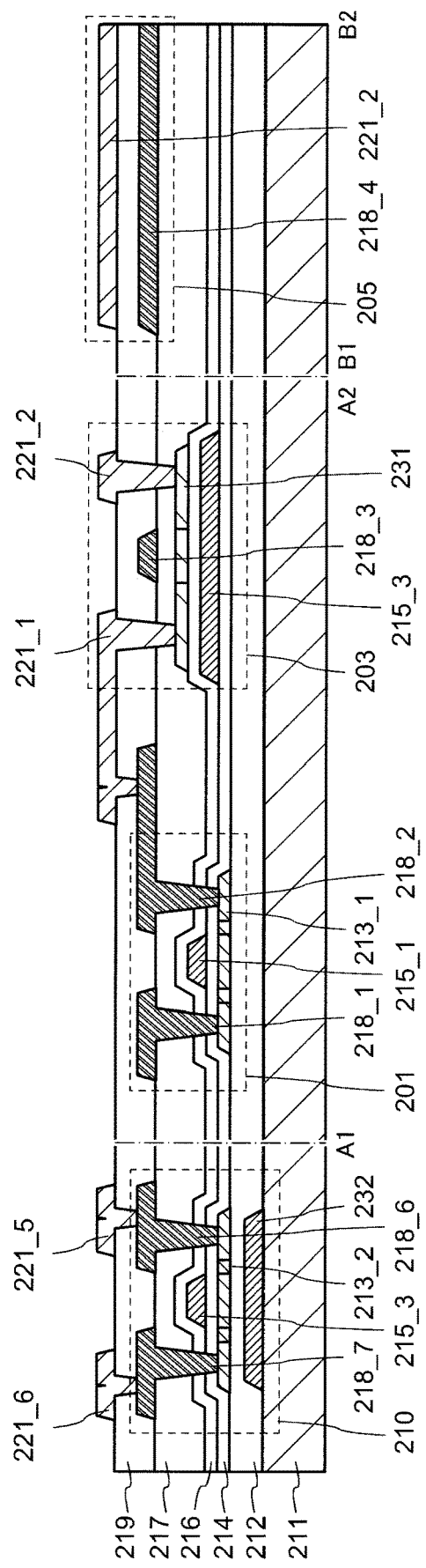
FIG. 10 is a cross-sectional view illustrating a manufacturing method of an optical sensor according to an embodiment of the present invention.

FIG. 10 is a diagram illustrating a process of forming the insulating film 219 and the conductive layers 221_1 to 221_6. First, the insulating film 219 is formed over the insulating film 217 and the conductive layers 218_1 to 218_9 by a CVD method or a sputtering method, for example, using silicon oxide or silicon nitride. Next, contact holes reaching the conductive layers 218_2, 218_8, 218_9 and the semiconductor layer 231 are formed in the insulating film 219. Next, a conductive film is formed over the insulating film 219 by a sputtering method, and the conductive film is processed by a photolithography process to form conductive layers 221_1 to 221_6. The conductive layer 221_1 is connected to the conductive layer 218_2, and the conductive layer 221_2 is connected to the conductive layer 218_2 and the semiconductor layer 231_1. The conductive layer 221_2 is connected to the semiconductor layer 231_1. The conductive layer 221_2 is provided in a region overlapping the conductive layer 218_4. The conductive layer 221_5 is connected to the conductive layer 218_8, and the conductive layer 221_6 is connected to the conductive layer 218_9.

Next, the insulating film 222 is formed over the conductive layers 221_1 to 221_5. Next, openings reaching the conductive layers 221_1, 221_5 are formed in the insulating film 222, and a conductive film is formed over the insulating film 222 by a sputtering method. Next, the conductive layers 223_1_1, 223_2 are formed by a photolithography process. Next, the insulating film 224 is formed over the conductive layers 223_1, 223_2. Next, openings reaching the conductive layers 223_1, 223_2 are formed in the insulating film 224, and a conductive film is formed over the insulating film 224 by a sputtering method. Finally, the conductive layers 225_1, 225_2 are formed by a photolithography process.

Through the above steps, the optical sensor 100 according to the embodiment of the present invention can be manufactured.

When forming a transistor using polycrystalline silicon and a transistor using an oxide semiconductor on the same substrate, the transistor using an oxide semiconductor is deteriorated by hydrogen which becomes a problem. In order to improve the characteristics of the transistor using polycrystalline silicon, a heating treatment is performed to terminate the defect level at the interface between the polycrystalline silicon layer and the gate insulating film. By this heat treatment, by mixing hydrogen into an oxide semiconductor, an oxide semiconductor is degenerated and becomes a conductor.

In the manufacturing method of the optical sensor 100 according to the embodiment of the present invention, the conductive layer 215_2 functioning as the light-shielding layer of the transistors 202 to 204 using an oxide semiconductor is formed of the same conductive film as the conductive layer 215_1 functioning as the gate electrode of the transistor 201 using polycrystalline silicon. A silicon oxide film is formed as the insulating film 216 and a silicon oxide film is formed as the insulating film 217 over the conductive layers 215_1 to 215_3. In this manner, the conductive layer 215_2 that absorbs hydrogen is arranged closer to the driver circuits 104_R, 104_L arranged in the peripheral region 103. Thus, hydrogen entering into the semiconductor layers 231_1 to 231_4 included in the transistors 202 to 204 can be suppressed. As described above, in the optical sensor 100 according to one embodiment of the present invention, not only the influence of light on the transistors 202 to 204 can be reduced, but also the influence of hydrogen can be suppressed. The conductive layer 215_2 is arranged above the semiconductor layer 213_1 formed of polycrystalline silicon. Thus, light can be reflected by the conductive layer 215_2, and the reflected light can be incident on the semiconductor layer 213_1, so that the light condensing efficiency can be improved.

The optical sensor 100 according to one embodiment of the present invention can be formed on a flexible substrate as well as a transparent glass substrate. Therefore, it can be compatible with various designs and various shapes.

Within the scope of the present invention, a person skilled in the art may arrive at various modifications, and it is understood that these modifications also belong to the scope of the present invention. For example, as long as the gist of the present invention is provided, a person skilled in the art who adds, deletes, or changes the design of components or adds, omits, or changes the conditions of processes to each of the above-described embodiments is also included in the scope of the present invention.

What is claimed is:

1. An optical sensor comprising:
    a substrate; and
    a first transistor, a second transistor, and a first light-shielding layer in a pixel area on the substrate,
    the first transistor including:
        a first polycrystalline silicon layer on the substrate;
        a first insulating film on the first polycrystalline silicon layer;
        a first gate electrode having a region overlapping the first polycrystalline silicon layer on the first insulating film;
        a second insulating film and a third insulating film on the first gate electrode; and
        a first source electrode and a first drain electrode electrically connected to the first polycrystalline silicon layer through openings in the second insulating film and the third insulating film,
    the second transistor including:
        an oxide semiconductor layer on the second insulating film;
        the third insulating film on the oxide semiconductor layer;
        a second gate electrode on the third insulating film;
        a fourth insulating film on the second gate electrode; and
        a second source electrode and a second drain electrode electrically connected to the oxide semiconductor layer through openings in the fourth insulating film,
    wherein
    the first light-shielding layer is provided between the first insulating film and the second insulating film and has a region overlapping the oxide semiconductor layer, and
    one of the first source electrode and the first drain electrode is electrically connected to the one of the second source electrode and the second drain electrode.

2. The optical sensor according to claim 1, further comprising:
    a capacitive element on the substrate,
    wherein the capacitive element includes a first electrode on the third insulating film, the fourth insulating film, and a second electrode on the fourth insulating film.

3. The optical sensor according to claim 2, wherein
    an amount of charge stored in the capacitive element is configured to be controlled according to an amount of light incident on the first polycrystalline silicon layer from the substrate side when the first transistor and the second transistor are in an OFF state.

4. The optical sensor according to claim 3, wherein
    the charge stored in the capacitive element is configured to be read out by changing the second transistor from an OFF state to an ON state when the first transistor is in the OFF state.

5. The optical sensor according to claim 1, wherein
    the other of the second source electrode and the second drain electrode is electrically connected to the second electrode.

6. The optical sensor according to claim 5, further comprising:
    a driver circuit on the substrate and arranged around the pixel area, and a third transistor included in the driver circuit,
    wherein the third transistor includes:
        a second light-shielding layer on the substrate;
        a fifth insulating film on the second light-shielding layer;
        a second polycrystalline silicon layer having a region overlapping the second shielding layer on the fifth insulating film;
        a third gate electrode having a region overlapping the second polycrystalline silicon layer on the first insulating film;
        the second insulating film and the third insulating film on the third gate electrode; and
        a third source electrode and a third drain electrode electrically connected to the second polycrystalline silicon layer through openings in the second insulating layer and the third insulating layer.

7. The optical sensor according to claim 6, wherein
    the second light-shielding layer is on the substrate side lower than the first light-shielding layer.

8. The optical sensor according to claim 1, wherein
    the first gate electrode includes the same conductive material as the first light-shielding layer.

9. The optical sensor according to claim 1, wherein
    the first source electrode and the first drain electrode include the same conductive material as the second gate electrode.

* * * * *